United States Patent
Park et al.

(10) Patent No.: US 7,855,391 B2
(45) Date of Patent: Dec. 21, 2010

(54) LEAD FRAME AND LIGHT EMITTING DEVICE PACKAGE USING THE SAME

(75) Inventors: Kwang Suk Park, Suwon-si (KR); Yu Ho Won, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/701,460

(22) Filed: Feb. 2, 2007

(65) Prior Publication Data

US 2007/0210325 A1    Sep. 13, 2007

(30) Foreign Application Priority Data

Feb. 2, 2006   (KR) ...................... 10-2006-0010003
Aug. 30, 2006  (KR) ...................... 10-2006-0083014

(51) Int. Cl.
    *H01L 33/00*    (2010.01)
(52) U.S. Cl. .............................. 257/98; 257/79; 257/81; 257/E23.047; 257/E23.052; 257/E23.053; 257/E33.062; 257/E33.066; 438/122; 438/123
(58) Field of Classification Search ............... 257/98, 257/81, 99, 686, 706, E23.051, E23.086, 257/E33.066, E33.063, E23.047, E23.052, 257/E23.053; 438/122, 123
    See application file for complete search history.

(56) References Cited

U.S. PATENT DOCUMENTS

| | | | |
|---|---|---|---|
| 6,274,924 B1 | 8/2001 | Carey et al. | |
| 2004/0159850 A1* | 8/2004 | Takenaka | 257/98 |
| 2008/0023721 A1* | 1/2008 | Lee et al. | 257/99 |

FOREIGN PATENT DOCUMENTS

| | | |
|---|---|---|
| JP | 11-163411 A | 6/1999 |
| KR | 10-2005-0089522 A | 9/2005 |
| KR | 10-2005-0111298 A | 11/2005 |
| KR | 10-2006-0079740 A | 7/2006 |
| WO | WO-2004/102685 A1 | 11/2004 |

* cited by examiner

*Primary Examiner*—David Vu
*Assistant Examiner*—Suberr Chi
(74) *Attorney, Agent, or Firm*—Birch, Stewart, Kolasch & Birch, LLP

(57) ABSTRACT

A lead frame and a light emitting device package using the same are disclosed. More particularly, a lead frame and a light emitting device package using the lead frame which can be easily manufactured and employ a multi-chip structure. The light emitting device package includes a first frame including a heat sink, a second frame coupled to an upper side of the first frame, the second frame including at least one pair of leads and a mount formed with a hole, and a molded structure for coupling the first and second frames to each other.

19 Claims, 9 Drawing Sheets

LEAD FRAME AND LIGHT EMITTING DEVICE PACKAGE USING THE SAME

This application claims the benefit of Korean Patent Application No. 10-2006-0010003, filed on Feb. 2, 2006 and Korean Patent Application No. 10-2006-0083014, filed on Aug. 30, 2006, which are hereby incorporated by references as if fully set forth herein.

BACKGROUND OF THE INVENTION

1. Field of the Invention

The present invention relates to a lead frame and a light emitting device package using the same, and more particularly, to a lead frame and a light emitting device package using the lead frame which can be easily manufactured and allow application of a multi-chip structure.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV. One of the reasons why GaN compound semiconductor has been highlighted is that it is possible to fabricate semiconductor layers capable of emitting green, blue, and white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

On the other hand, initially-developed green LEDs were fabricated using GaP. Since GaP is an indirect transition material causing a degradation in efficiency, the green LEDs fabricated using this material cannot practically produce light of pure green. By virtue of the recent success of growth of an InGaN thin film, however, it has been possible to fabricate a high-luminescent green LED.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

Such an LED is packaged, together with other previously fabricated elements, for the use thereof. An example of an LED package 10 is illustrated in FIG. 1.

The illustrated LED package 10 includes a plastic package body 11 including a heat sink 12 therein, and an LED chip 20 mounted on the package body 11.

The LED chip 20 is electrically connected to leads 13 via wires 14. Sealing materials, for example, resin 15 and silicon 17, are filled over the LED chip 20, and in turn, a lens 16 is provided over the sealing materials.

In the LED package having the above-mentioned structure, heat generated during operation of the LED is transferred via the package body 11. However, since the package body 11 is made of a plastic material exhibiting a low heat transfer rate, there are drawbacks of a degraded heat discharge effect, and thus, a degradation in the optical characteristics of the LED.

Furthermore, a packaging process for inserting the heat sink 12 into an aperture perforated in the plastic package body 11 is difficult to anticipate a rapid process rate, and cannot ensure smooth insertion of the heat sink 12 if a width of the heat sink 12 is not equal to a width of the aperture in the plastic package body 11.

In particular, it is difficult to implement an illumination apparatus, such as a backlight, by arranging LEDs, due to problems associated with size, light uniformity, and costs. In this case, also, it is difficult to achieve a multi-chip package in which red, green, and blue LEDs are included in a single package.

SUMMARY OF THE INVENTION

Accordingly, the present invention is directed to a lead frame and a light emitting device package using the same that substantially obviate one or more problems due to limitations and disadvantages of the related art.

An object of the present invention is to provide a lead frame for a light emitting device and a light emitting device package which can be easily manufactured, allow application of a multi-chip structure, and emit various colors of lights including white light.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention as embodied and broadly described herein, a light emitting device package comprises: a first frame including a heat sink; a second frame coupled to an upper side of the first frame, the second frame including at least one pair of leads and a mount formed with a hole; and a molded structure for coupling the first and second frames to each other.

In a second aspect of the present invention, there is provided a lead frame comprising: a first frame including a heat sink; and a second frame coupled to the first frame, the second frame including at least one pair of leads, and a mount formed with a hole.

In a third aspect of the present invention, there is provided a light emitting device package comprising: a heat sink; a frame coupled to the heat sink and including at least one pair of leads and a mount formed with a hole; and a molded structure for coupling the heat sink and the frame to each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
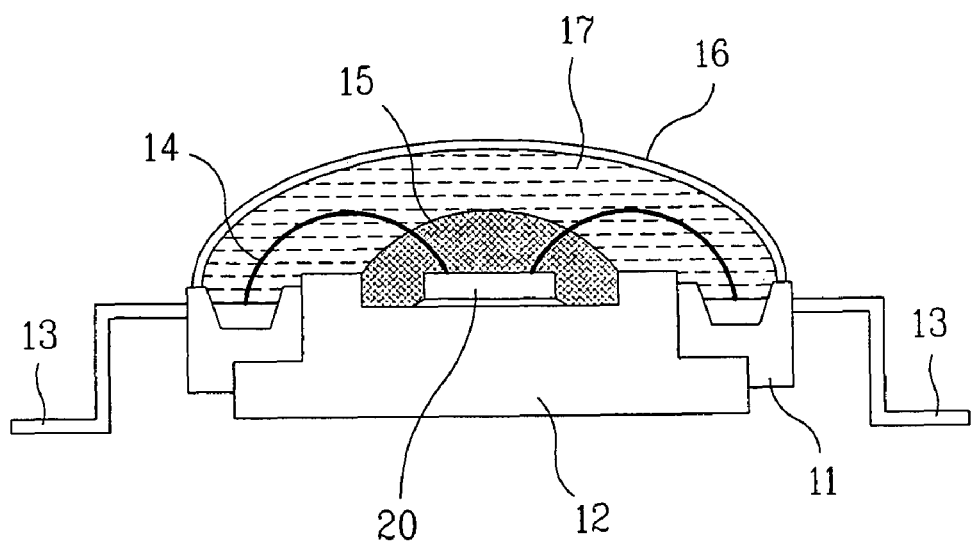
FIG. 1 is a sectional view illustrating an example of a conventional light emitting device package.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims The same reference numbers will be used throughout the drawings to refer to the same or like parts. In the drawings, dimensions of layers and regions are exaggerated for clarity of description.

It will be understood that, when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

The above terms first, second, etc. are used simply to discriminate any one element, component, region, layer, or area from other elements, components, regions, layers, or areas. Accordingly, the terms first region, first layer, first area, etc., which will be described hereinafter, may be replaced by the terms second region, second layer, or second area, etc.

Hereinafter, the preferred embodiments of the present invention will be described in detail with reference to the accompanying drawings.

Figure 2:
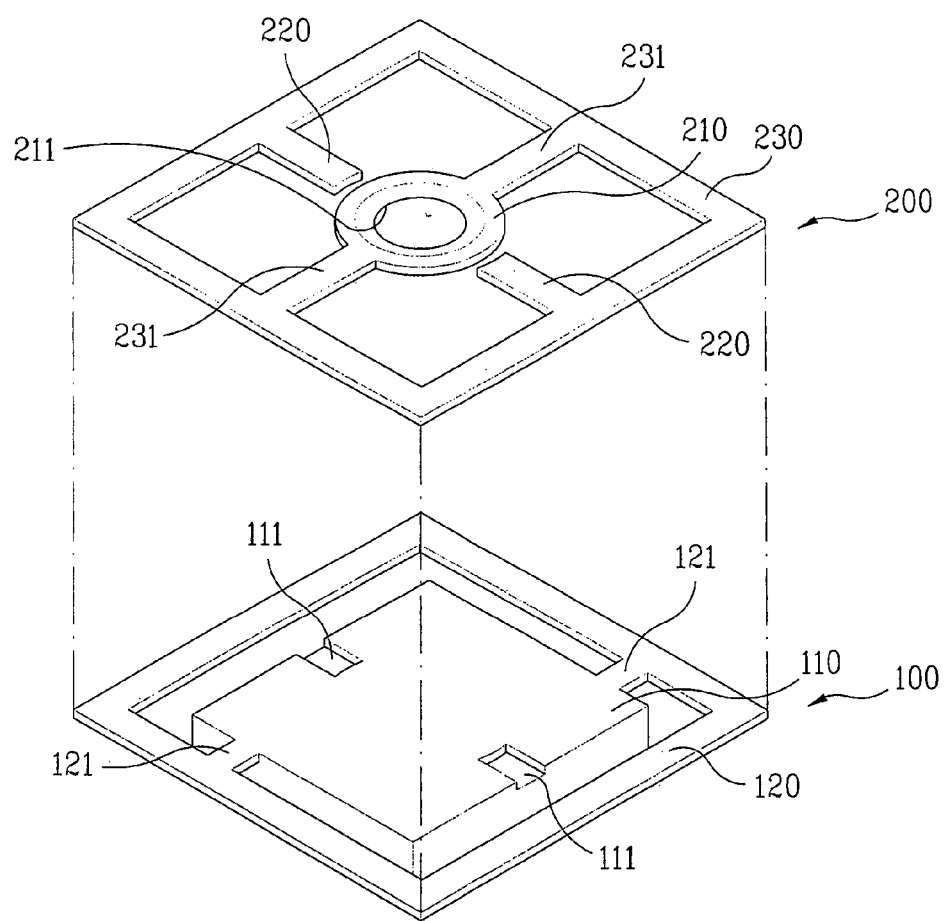
FIG. 2 is an exploded perspective view illustrating a lead frame according to a first embodiment of the present invention.

As shown in FIG. 2, there are provided a first frame 100 and a second frame 200, which may be coupled to each other, so as to complete a lead frame, on which a light emitting device chip will be mounted.

Specifically, the first frame 100 may include a first rim 120, and a heat sink 110 located inside the first rim 120, the heat sink 110 being connected to the first rim 120 via first connectors 121. The second frame 200 may include a second rim 230, a mount 210 located inside the second rim 230, the mount 210 being connected to the second rim 230 via second connectors 231, and leads 220 extended from the second rim 230 toward the mount 210.

In this case, the light emitting device chip is coupled to the heat sink 110, so as to be operated by the heat sink 110. The heat sink 110 is able to discharge heat generated during operation of the light emitting device chip, and in particular, may be made of a metal having a high thermal-conductivity.

The mount 210 may be internally formed with a hole 211 for mounting the light emitting device chip. The mount 210 may have a circular shape and be inclined toward the center of the second frame 200.

The inclined portion of the mount 210 may be formed with a film by use of a high-reflectivity material, such as a metal, to provide the mount 210 with a reflective surface.

As shown in FIG. 2, the mount 210 may be connected to the second rim 230 via two second connectors 231, and the heat sink 110 may be connected to the first rim 120 via two first connectors 121.

These connectors 121 and 231 and rims 120 and 230 can be removed in a following light emitting device packaging process.

Meanwhile, to couple the first frame 100 and the second frame 200 to each other, the heat sink 110 has first recesses 111 formed at positions where the heat sink 110 is overlapped with the leads 220. This has the effect of preventing electrical short-circuit between the leads 220 and the heat sink 110.

Figure 3:
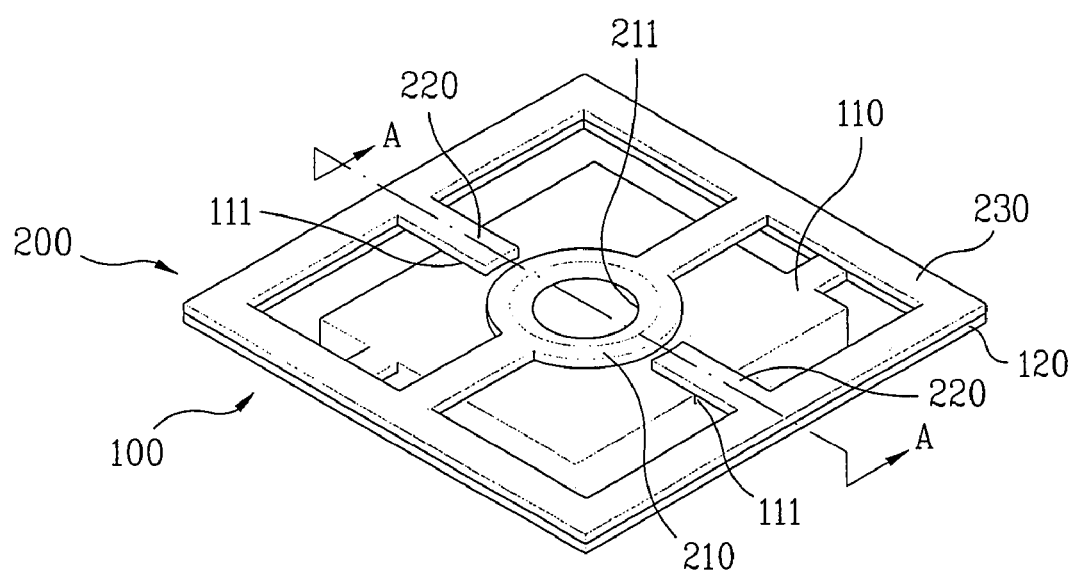
FIG. 3 is a perspective view illustrating an assembled state of the lead frame shown in FIG. 2.

FIG. 3 illustrates a coupled state of the first and second frames 100 and 200.

Figure 4:
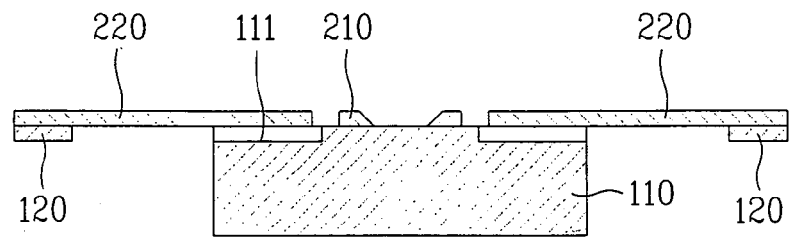
FIG. 4 is a sectional view taken along the line A-A of FIG. 3.

Also, FIG. 4 illustrates the cross section of the coupled first and second frames 100 and 200.

Figure 5:
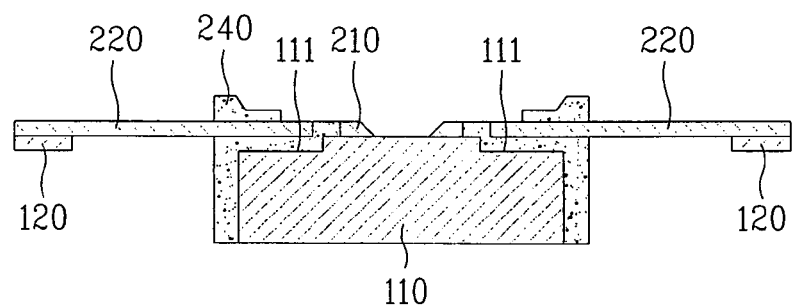
FIG. 5 is a sectional view illustrating a state in which a molded structure is provided at the lead frame shown in FIG. 4.

Referring to FIG. 5, a molded structure 240 is formed through the coupled first and second frames 100 and 200, for securing the first and second frames 100 and 200 to each other.

In this case, the molded structure 240 is formed by a transfer molding process or injection molding process.

After forming the molded structure 240, the above mentioned connectors 121 and 231 and rims 120 and 230 are removed. Then, each of the leads 220 is bent, at its appropriate position not surrounded by the molded structure 240, to have a shape as shown in FIG. 6.

Here, the reason why bending the leads 220 is to facilitate bonding of the light emitting device package to a substrate, such as a sub-mount substrate.

Figure 6:
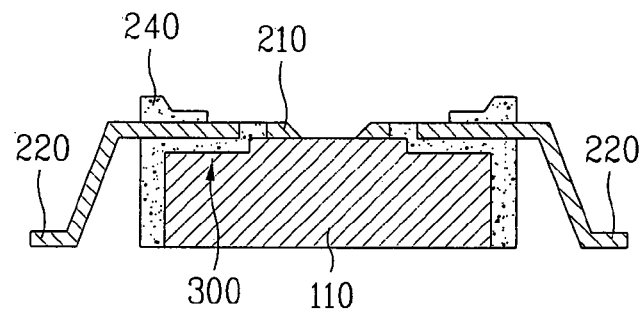
FIG. 6 is a sectional view of the lead frame according to the first embodiment of the present invention.

As shown in FIG. 6, a space 300 is defined between the heat sink 110 and the leads 220. Specifically, the space 300 may be defined by the first recesses 111 formed at the heat sink 110.

Figure 7:
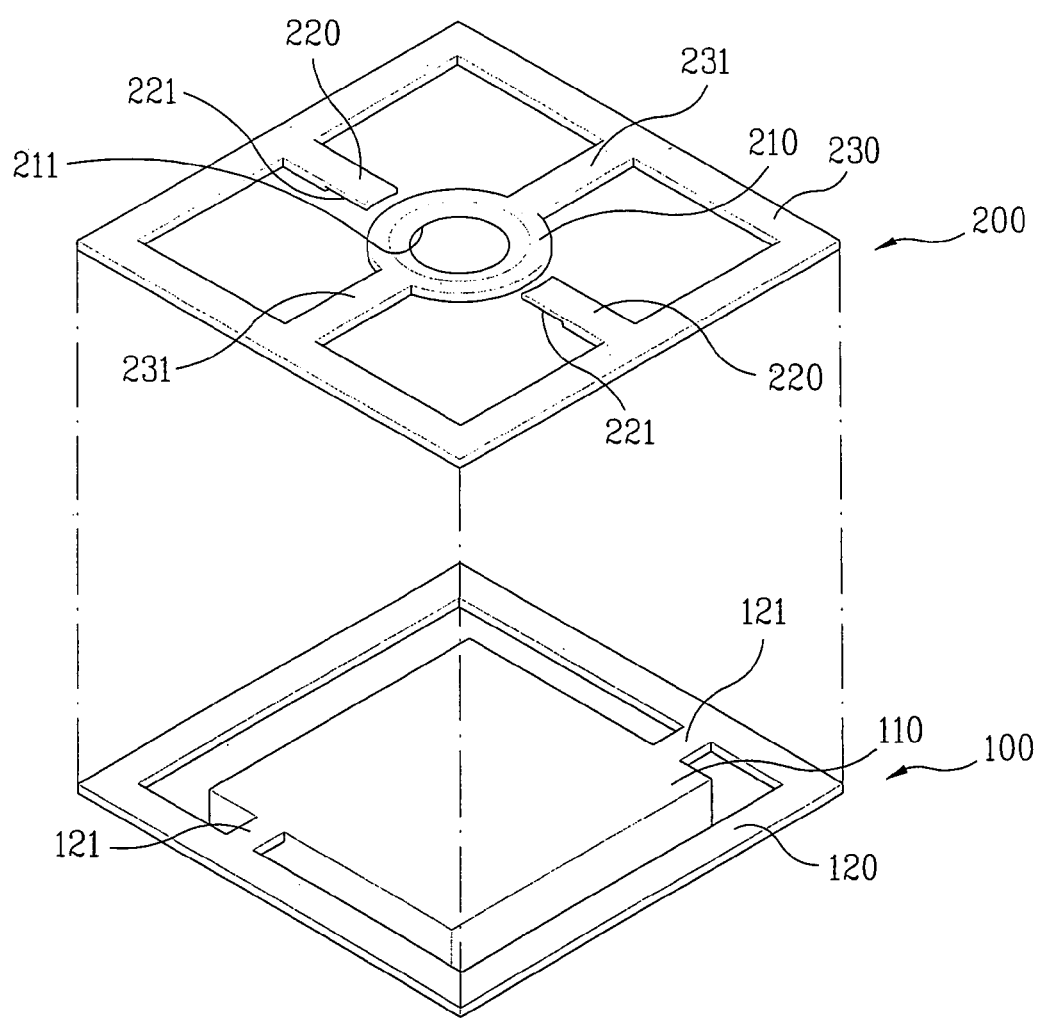
FIG. 7 is an exploded perspective view illustrating a lead frame according to a second embodiment of the present invention.

In an alternative embodiment, as shown in FIG. 7, instead of forming the recesses 111 at the heat sink 110 in order to define the space 300, a second recess 221 may be formed at a part of a lower surface of each lead 220. Other configurations are identical to those shown in FIG. 2.

Figure 8:
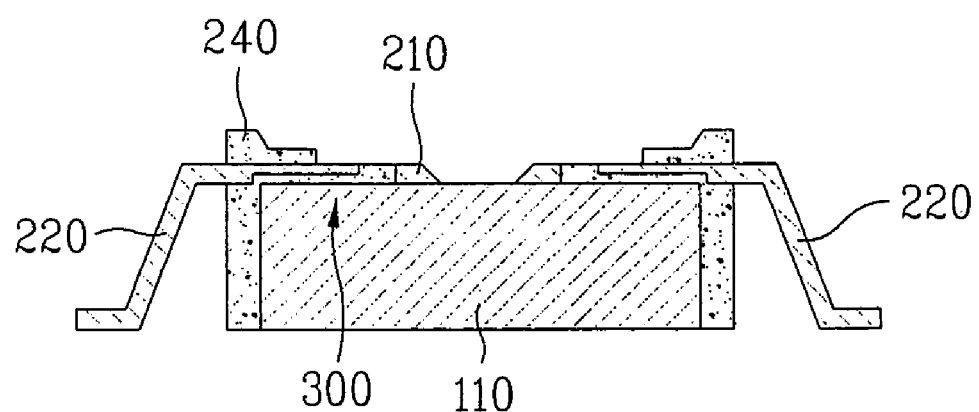
FIG. 8 is a sectional view illustrating an assembled state of the lead frame shown in FIG. 7.

With the same procedure as described above with reference to FIGS. 3 to 5, a lead frame as shown in FIG. 8 can be accomplished by the configurations shown in FIG. 7.

As shown, in the present embodiment, the space 300 is defined, by the second recesses 221 formed at the lower surfaces of the leads 220, at positions where the heat sink 110 is overlapped with the leads 220.

As occasion demands, defining the space 300 by forming the second recesses 221 at the leads 220 may be more advantageous than defining the space 300 by forming the first recesses 111 at the heat sink 110.

This is because, when a plurality of light emitting device chips are coupled to the lead frame, namely, when forming a multi-chip package, the number of the leads 220 have to be increased as many as the number of the chips, and consequently, the space 300 for preventing electrical short-circuit have to be increased in proportion to the increased number of the leads 220.

Since the lower first frame 100 including the heat sink 110 is made of a thick material, however, it may be difficult to pattern the first recesses 111 in the first frame 100 due to a relatively complex shape of the first recesses 111.

On the other hand, the upper second frame 200 has a smaller thickness than that of the lower first frame 100, and therefore, the space 300 can be defined easily by forming the second recesses 221 at the leads 220 via an etching process or stamping process.

FIGS. 9 to 14 illustrate an embodiment in which the lead frame is used to construct a multi-chip package.

Figure 9:
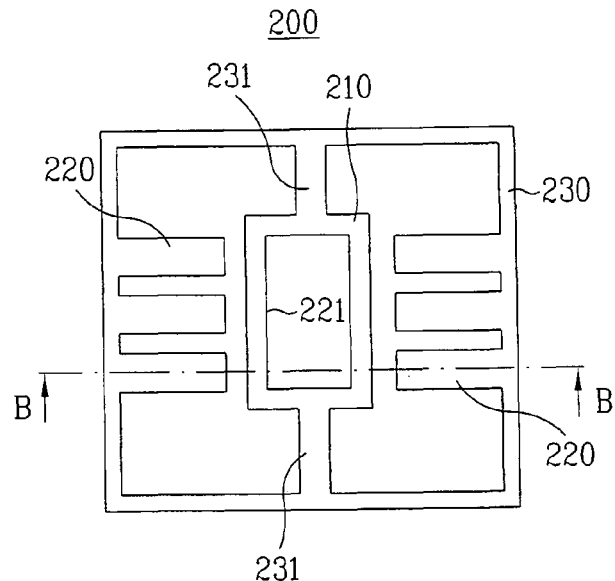
FIG. 9 is a plan view illustrating an example of a second frame for forming a multi-chip structure on the lead frame according to the present invention.

As shown in FIG. 9, to construct a package including a plurality of light emitting device chips, plural pairs of leads 220 may be provided.

In FIG. 9, more specifically, the second frame 200 is provided with three pairs of leads 220, for application of three light emitting device chips.

Figure 10:
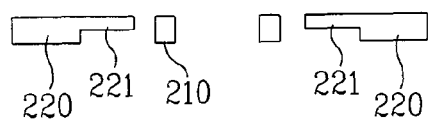
FIG. 10 is a sectional view taken along the line B-B of FIG. 9.

As shown in FIG. 10, each lead 220 may have the second recess 221 formed at the lower surface thereof as described above, to define the space 300 (See FIG. 12).

Accordingly, all the leads 220 have no risk of coming into contact with the heat sink 110, and thus, it is possible to prevent electrical short-circuit between the leads 220 and the heat sink 110.

The mount 210 may be longitudinally formed with the hole 221, in consideration of a mounting space for the plurality of light emitting device chips. The hole 221 may have a rectangular or elliptical shape.

The mount 210 may be connected to the second rim 230 via the second connectors 231.

Figure 11:
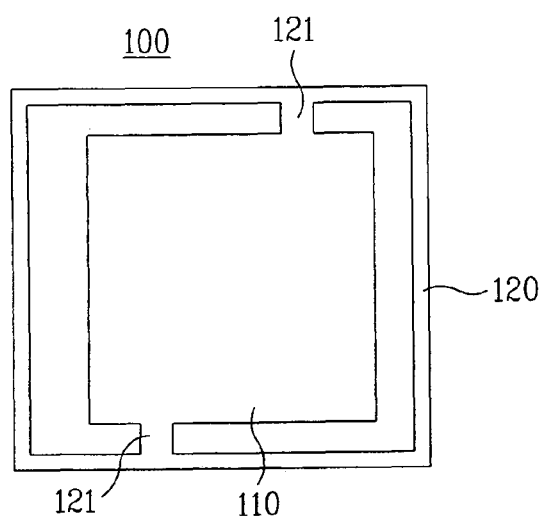
FIG. 11 is a plan view illustrating an example of a first frame for forming a multi-chip structure on the lead frame according to the present invention.

In the present embodiment, as shown in FIG. 11, the first frame 110 includes the heat sink 110, and similarly, the heat sink 110 may be connected to the first rim 120 via the first connectors 121.

Figure 12:
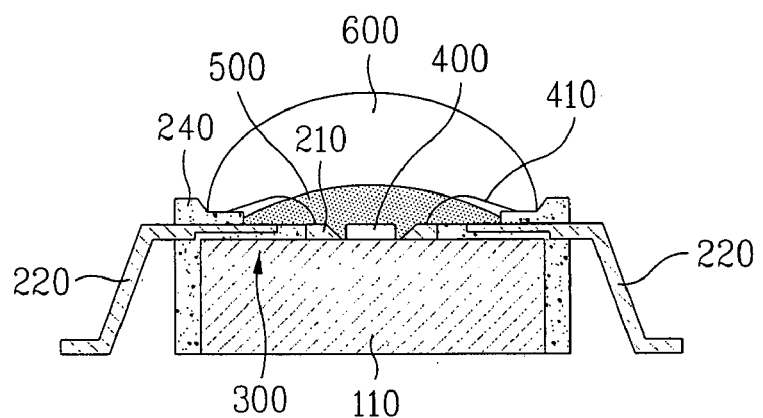
FIG. 12 is a sectional view illustrating an example of a light emitting device package according to the present invention.
Figure 13:
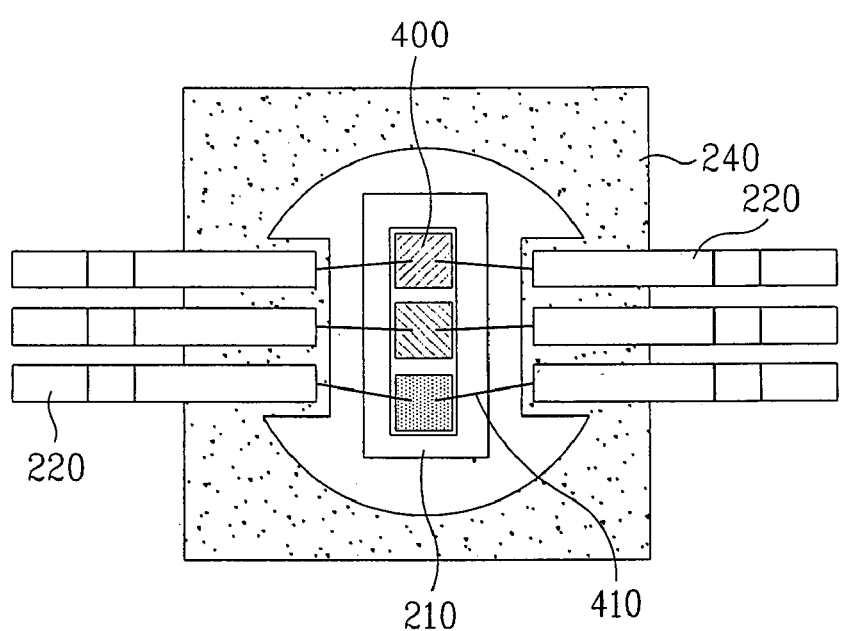
FIG. 13 is a plan view of the light emitting device package shown in FIG. 12.

The first and second frames 100 and 200 as shown in FIGS. 9 to 11 may be coupled to each other, to complete the lead frame via the above described procedure. Then, if one or more light emitting device chips are mounted to the lead frame, a multi-chip package as shown in FIGS. 12 and 13 can be accomplished.

Specifically, the mount 210 and the leads 220 are coupled onto the heat sink 110 by the molded structure 240, to thereby complete the lead frame. One or more light emitting device chips 400 are mounted on the mount 210.

The light emitting device chips 400 are attached to the heat sink 110 by use of a heat transfer material, and electrically connected to the leads 220 via wires 410.

Thereafter, a sealing material 500 may be filled over the light emitting device chips 400, and in turn, a lens 600 may be mounted over the sealing material 500.

The sealing material 500 may be selected from among a silicone sealing material and other resins including epoxy resin.

Meanwhile, as occasion demands, the sealing material 500 may contain phosphor for changing colors of lights discharged from the light emitting device chips 400.

FIG. 13 illustrates a light emitting device package, which includes three light emitting device chips 400 for emitting three colors of lights. Here, the three colors of lights may include red, green, and blue lights, and white color may be created by blending the three colors of lights.

Of course, it will be appreciated that other light emitting device chips 400 for emitting other colors of lights may be used.

Figure 14:
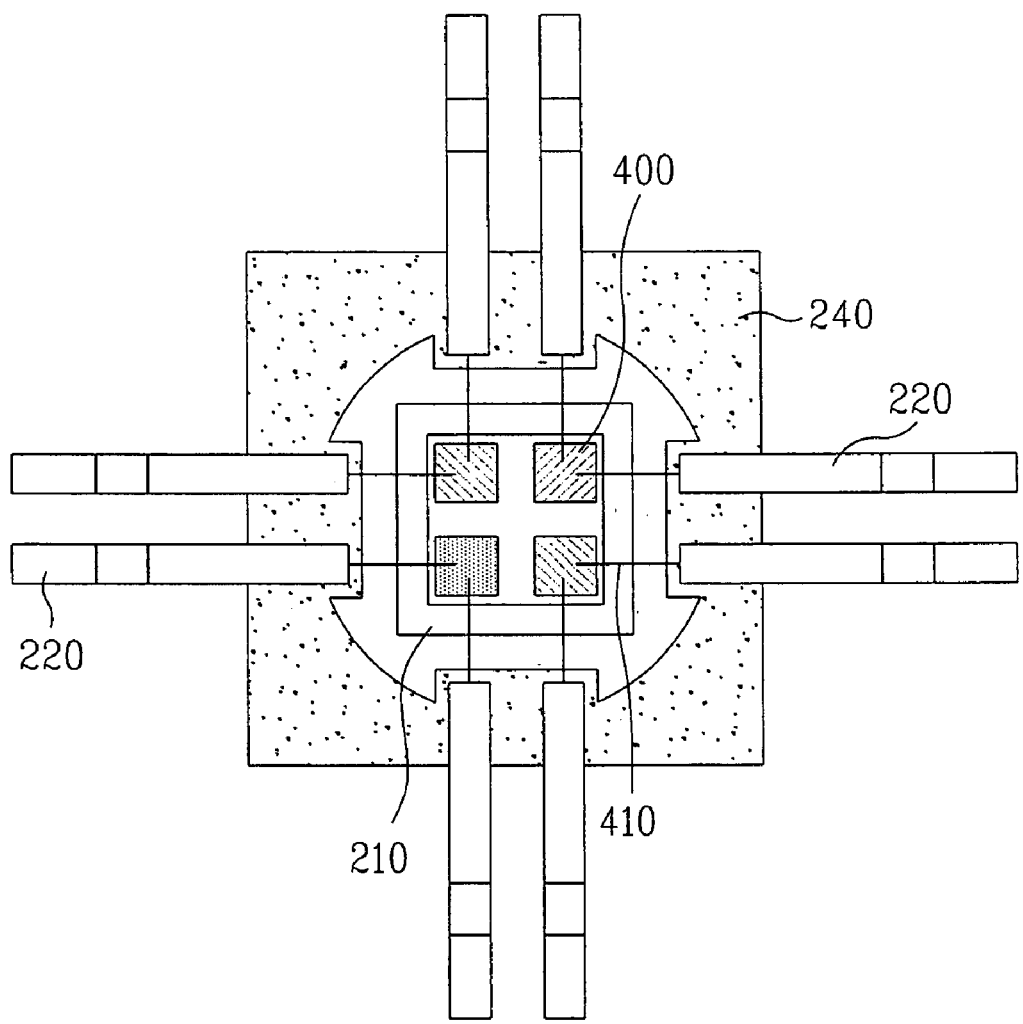
FIG. 14 is a plan view illustrating another example of the light emitting device package according to the present invention.

Meanwhile, as shown in FIG. 14, a light emitting device package may include four light emitting device chips 400.

For example, in addition to the red, green, and blue light emitting device chips, the package may further include a light emitting device chip for emitting a supplementary color of light.

Although FIG. 14 illustrates a state in which the four light emitting device chips 400 and the leads 220 are radially arranged, it will be appreciated that they are arranged in a line as shown in FIG. 13.

In addition to the above mentioned four light emitting device chips 400, if necessary, additional light emitting device chips 400 may be arranged together with the leads 200.

Of course, other light emitting device packages capable of emitting various colors of lights except for white light can be accomplished.

Moreover, it will be appreciated that multiple light emitting device chips for emitting white light or other single color light may be provided to achieve an increase in brightness. Accordingly, the package having the increased brightness can be used as an illumination package or other decorative packages.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package, comprising:
a first frame including a heat sink;
a second frame on an upper side of the first frame, the second frame including at least one pair of leads and a mount including a hole; and
a molded structure for coupling the first and second frames to each other,
wherein a space is defined between the heat sink and the leads for providing a gap between the heat sink and the leads,
wherein the space includes first recesses of the heat sink at positions where the heat sink is overlapped with the leads,
wherein the first recesses are recessed from a surface of the heat sink,
wherein the mount has an inwardly inclined portion having a reflective surface,
wherein the mount contacts the heat sink, and
wherein the mount and the leads comprise a common material.

2. The light emitting device package according to claim 1, wherein the molded structure is formed in the space.

3. The light emitting device package according to claim 1, wherein the mount has a circular, rectangular, or elliptical shape.

4. The light emitting device package according to claim 1, wherein the leads comprise three or more pairs of leads.

5. The light emitting device package according to claim 1, further comprising:
at least one light emitting device chip located inside the mount.

6. The light emitting device package according to claim 5, wherein the light emitting device chip is attached to the heat sink and electrically connected to the leads.

7. The light emitting device package according to claim 6, wherein the light emitting device chip is connected to the leads via wires.

8. The light emitting device package according to claim 5,
wherein the light emitting device chip is mounted on a surface of the heat sink, and
wherein the mount contacts the surface of the heat sink.

9. The light emitting device package according to claim 1, wherein a plurality of light emitting device chips are mounted inside the mount.

10. The light emitting device package according to claim 1, further comprising:
a sealing material; and
a lens,
wherein the sealing material and the lens are provided over the mount in sequence.

11. The light emitting device package according to claim 10, wherein the sealing material includes silicone or epoxy.

12. The light emitting device package according to claim 1, wherein the reflective surface of the mount comprises:
a reflective film on the inwardly inclined portion of the mount.

13. A lead frame, comprising:
a first frame including a first rim and a heat sink connected to the first rim; and
a second frame on the first frame, the second frame including a second rim and at least one pair of leads, and a mount including a hole, the mount being located on the heat sink, the at least one pair of leads connected to the second rim,
wherein a space is defined between the heat sink and the leads for providing a gap between the heat sink and the leads,
wherein the space includes first recesses being recessed from a surface of the heat sink at positions where the heat sink is overlapped with the leads or second recesses formed in the leads at positions where the leads are overlapped with the heat sink, a thickness of a portion of the leads having the second recesses being thinner than a thickness of the mount,
wherein the mount has an inwardly inclined portion having a reflective surface,
wherein the mount contacts the heat sink, and
wherein the mount and the leads comprise a common material.

14. The lead frame according to claim 13, wherein the mount is connected to the second rim of the second frame.

15. The lead frame according to claim 13, wherein the heat sink has a thickness greater than a thickness of the leads.

16. The lead frame according to claim 13, wherein the first rim and the second rim have a common size.

17. The lead frame according to claim 13, wherein the reflective surface of the mount comprises:
a reflective film on the inwardly inclined portion of the mount.

18. A light emitting device package, comprising:
a heat sink;
a frame on the heat sink and including at least one pair of leads and a mount including a hole; and
a molded structure for coupling the heat sink and the frame to each other,
wherein a space is defined between the heat sink and the leads for providing a gap between the heat sink and the leads,
wherein the space includes first recesses being recessed from a surface of the heat sink at positions where the heat sink is overlapped with the leads or second recesses formed in the leads at positions where the leads are overlapped with the heat sink, a thickness of a portion of the leads having the second recesses being thinner than a thickness of the mount,
wherein the mount has an inwardly inclined portion having a reflective surface,
wherein the mount contacts the heat sink, and
wherein the mount and the leads comprise a common material.

19. The light emitting device package according to claim 18, wherein the reflective surface of the mount comprises:
a reflective film on the inwardly inclined portion of the mount.

* * * * *